United States Patent
Shibata et al.

(10) Patent No.: US 9,750,133 B2
(45) Date of Patent: Aug. 29, 2017

(54) PRINTED CIRCUIT BOARD

(71) Applicant: Kabushiki Kaisha Toshiba, Minato-ku, Tokyo (JP)

(72) Inventors: Toyokazu Shibata, Kanagawa (JP); Osamu Wada, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/967,109

(22) Filed: Dec. 11, 2015

(65) Prior Publication Data

US 2016/0270218 A1  Sep. 15, 2016

(30) Foreign Application Priority Data

Mar. 12, 2015  (JP) .................................. 2015-049925

(51) Int. Cl.
*H05K 1/02* (2006.01)
*H05K 1/18* (2006.01)

(52) U.S. Cl.
CPC ......... *H05K 1/0284* (2013.01); *H05K 1/0201* (2013.01); *H05K 1/181* (2013.01); *H05K 2201/09036* (2013.01)

(58) Field of Classification Search
CPC .......... H05K 2201/09036; H05K 2201/09072; H05K 1/181; H05K 1/0203; H05K 1/0204; H05K 1/0206; H05K 1/0201; H05K 1/0284
See application file for complete search history.

(56) References Cited

U.S. PATENT DOCUMENTS

| | | | |
|---|---|---|---|
| 6,205,028 B1 | 3/2001 | Matsumura | |
| 7,250,352 B2* | 7/2007 | Mizutani | H05K 3/0052 438/460 |
| 2007/0018311 A1* | 1/2007 | Chang | H05K 1/0203 257/712 |
| 2009/0166895 A1* | 7/2009 | Noguchi | H05K 1/05 257/786 |
| 2013/0010432 A1* | 1/2013 | Sundstrom | H05K 1/0207 361/748 |
| 2016/0014879 A1* | 1/2016 | Li | H05K 1/0206 361/712 |

FOREIGN PATENT DOCUMENTS

| | | |
|---|---|---|
| JP | 07-321423 A | 12/1995 |
| JP | 11-040901 A | 2/1999 |
| JP | 2006-147333 A | 6/2006 |
| JP | 2006-229101 A | 8/2006 |

* cited by examiner

*Primary Examiner* — Hoa C Nguyen
*Assistant Examiner* — Amol Patel
(74) *Attorney, Agent, or Firm* — White & Case LLP

(57) ABSTRACT

According to one embodiment, there is provided a printed circuit board including a substrate having a trench between a first region and a second region. The first region is a region where a first package is to be mounted. The second region is a region where a second package is to be mounted. The trench has an opening portion in at least one of a first main surface and a second main surface of the substrate. The first main surface is a surface on which the first package is placed. The second main surface is positioned on reverse side of the first main surface of the substrate.

17 Claims, 11 Drawing Sheets

FIG.9
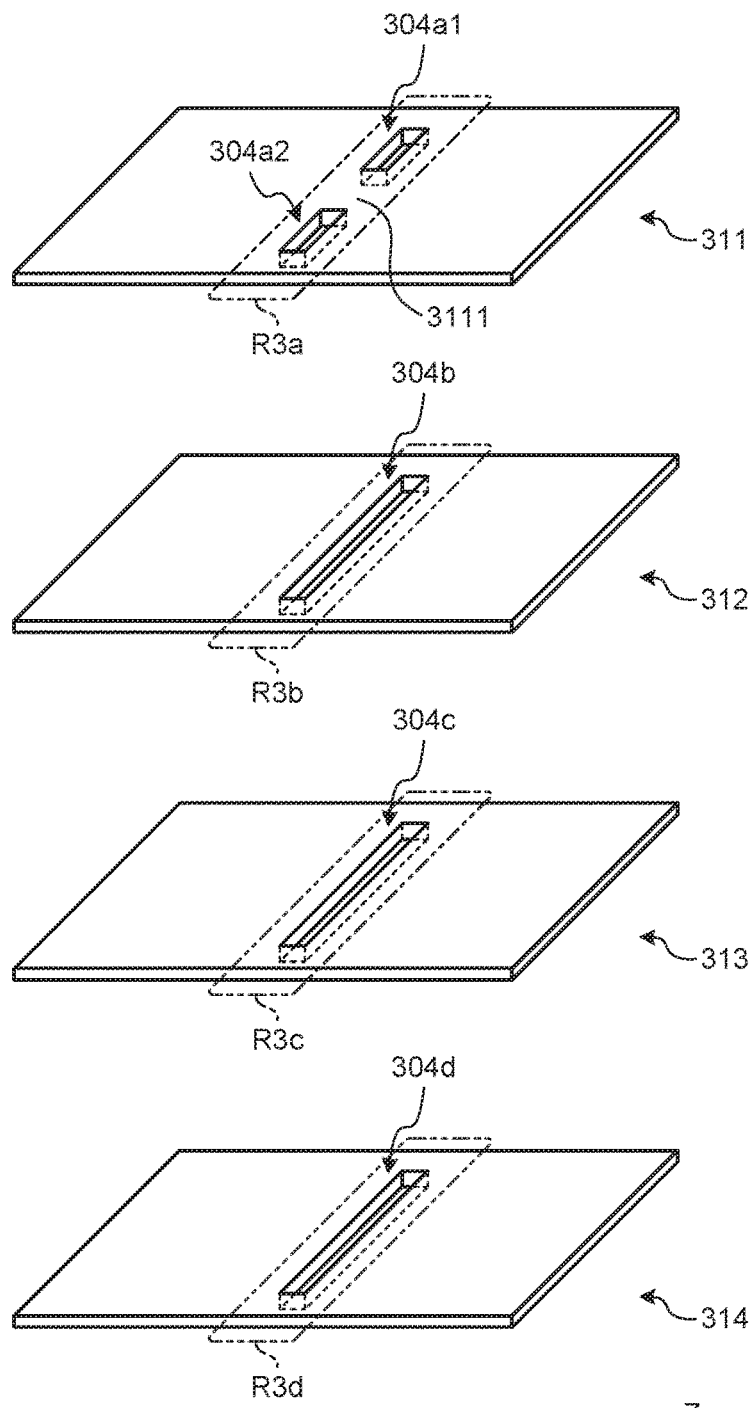
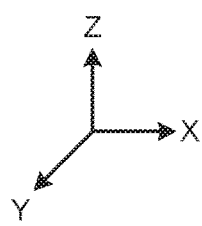

PRINTED CIRCUIT BOARD

CROSS-REFERENCE TO RELATED APPLICATIONS

This application is based upon and claims the benefit of priority from Japanese Patent Application No. 2015-049925, filed on Mar. 12, 2015; the entire contents of which are incorporated herein by reference.

FIELD

Embodiments described herein relate generally to a printed circuit board.

BACKGROUND

In printed circuit boards, multiple packages may be mounted on the board. In this case, it is desired to reduce heat transmission between the multiple packages.

BRIEF DESCRIPTION OF THE DRAWINGS

FIG. 9 is an exploded perspective view showing the configuration of the printed circuit board according to the third embodiment;

DETAILED DESCRIPTION

In general, according to one embodiment, there is provided a printed circuit board including a substrate having a trench between a first region and a second region. The first region is a region where a first package is to be mounted. The second region is a region where a second package is to be mounted. The trench has an opening portion in at least one of a first main surface and a second main surface of the substrate. The first main surface is a surface on which the first package is placed. The second main surface is positioned on reverse side of the first main surface of the substrate.

Exemplary embodiments of a printed circuit board will be explained below in detail with reference to the accompanying drawings. The present invention is not limited to the following embodiments.

(First Embodiment)

Figure 1:
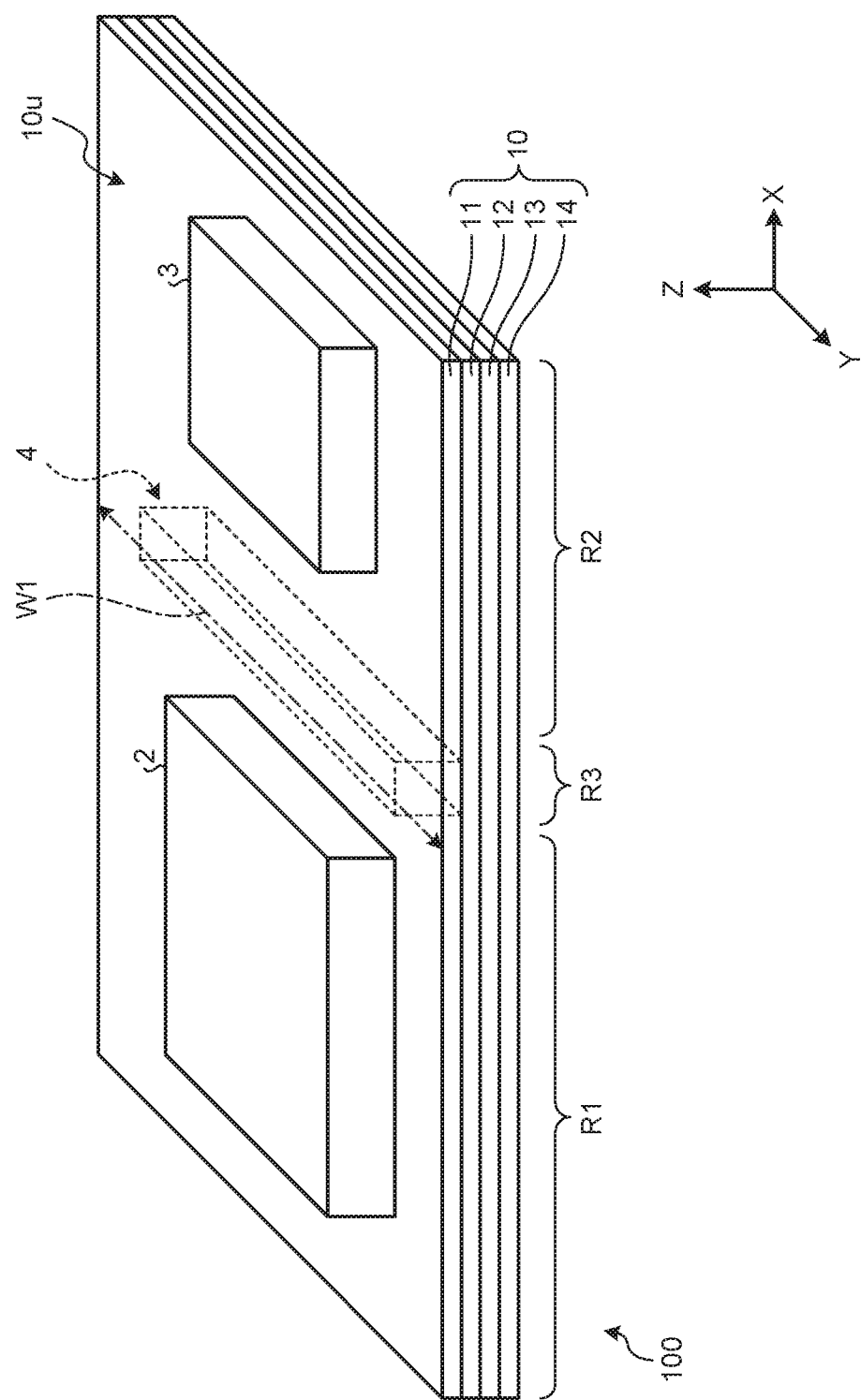
FIG. 1 is a perspective view showing the configuration of a printed circuit board according to a first embodiment.

A printed circuit board 100 according to the first embodiment will be described using FIG. 1. FIG. 1 is a perspective view showing the configuration of the printed circuit board 100. In FIG. 1, let an X direction be the direction from the center of a package 2 (the centroid of the package 2) to the center of a package 3 (the centroid of the package 3) along the uppermost surface (front side) 10U of the printed circuit board 100, a Z direction be a direction substantially perpendicular to the uppermost surface 10U of the printed circuit board 100, and a Y direction be a direction substantially perpendicular to the X direction and Z direction.

The printed circuit board 100 is used for an electronic device and, for example, the packages 2 and 3 are mounted. The package 2 is, for example, a microcomputer, a CPU, a power supply IC, or the like and is likely to generate heat. The package 3 is, for example, a memory, an image sensor, or the like and is likely to be affected by heat, so that the influence of heat from the surroundings needs to be suppressed.

For example, with the printed circuit board 100 small like a module product, heat from the package 2 large in heat generation is transmitted via the printed circuit board 100 to the adjacent package 3, and the package 3 is heated, so that the package 3 may degrade or lower in performance. For each package 2, 3, an operation guarantee temperature range is specified. Where its temperature is above the temperature upper limit of the operation guarantee temperature range permissible for the package 3 because of heat generation of the package 2, a first method can be thought of which raises the ability to radiate heat of the printed circuit board 100, thereby suppressing increase in temperature. In the first method, a heat sink is attached to the printed circuit board 100, or the board size of the printed circuit board 100 is increased to extend the distance between the packages 2 and 3. However, since the first method needs adding a heat sink or increasing the board size of the printed circuit board 100, the production cost of the printed circuit board 100 is likely to increase. Further, the size of an electronic device in which the printed circuit board 100 is used is likely to become larger.

Further, a second method can be thought of which suppresses heat transmission between the packages 2 and 3 by making a vertically-extending-through opening in a portion of the printed circuit board 100 via which heat is not wanted to be transmitted, that is, the portion between the packages 2 and 3. However, in the second method, since the opening extends through the printed circuit board 100, signal lines connecting the packages 2 and 3 are designed to circumvent the opening. Thus, it is difficult to make signal lines extend linearly in the X direction between the packages 2 and 3, so that the signal lines between the packages 2 and 3 are likely to become longer, and thus the R (resistance) components and L (inductance) components of the signal lines between the packages 2 and 3 are likely to increase. As the R and L components of the signal lines increase, the waveforms of signals transmitted via the signal lines become likely to be distorted (waveforms become likely to overshoot or deteriorate in shape). Or because the distances along the Y direction between the signal lines connected between the packages 2 and 3 are likely to decrease, the waveforms of signals transmitted via the signal lines are likely to be distorted (waveforms are likely to overshoot or deteriorate in shape) due to the influence of crosstalk. Or where a component is placed on the circumvented portion, drawing signal lines itself may be difficult because the component becomes an obstacle. Further, since lines are drawn to circumvent the opening, the size of an electronic device in which the printed circuit board 100 is used is likely to become larger.

Accordingly, in the first embodiment, by providing a trench 4 which does not penetrate vertically (in the Z direction) but has an opening portion 4p in upper side (+Z side) or lower side (−Z side) between the packages 2 and 3 in the printed circuit board 100, both the ability to thermally isolate and the ability to wire for the packages 2 and 3 are achieved.

Figure 2:
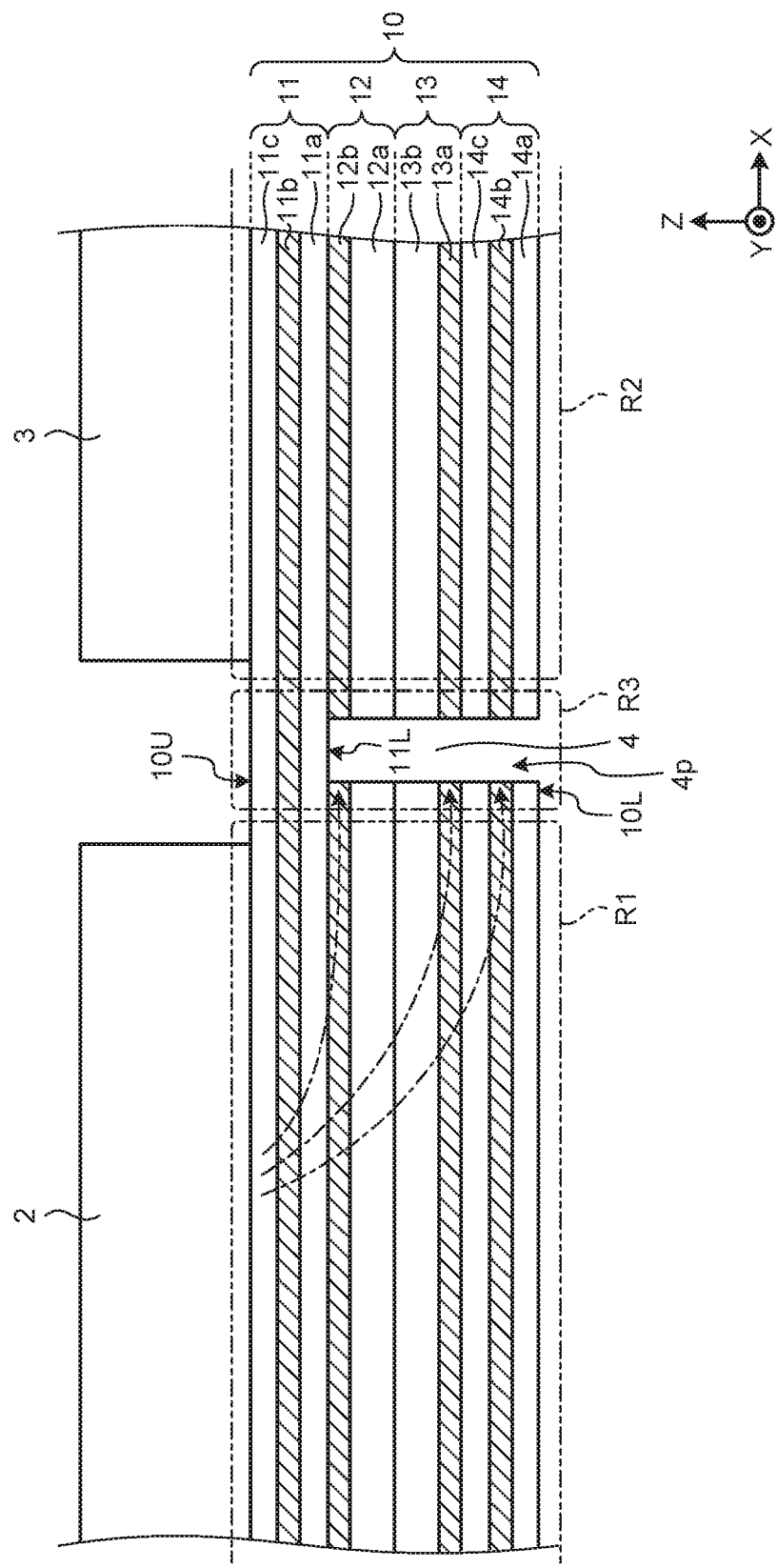
FIG. 2 is an enlarged cross-sectional view showing the configuration of a trench and its vicinity of the printed circuit board according to the first embodiment.

Specifically, the printed circuit board 100 has a substrate 10 where the trench 4 is formed. The substrate 10 has a region (first region) R1, a region (second region) R2, and a region R3 as shown in FIG. 2. FIG. 2 is an enlarged cross-sectional view showing the configuration of the trench 4 and its vicinity of the printed circuit board 100. In FIG. 2, for simplicity of illustration, the configurations in the packages 2 and 3 are omitted from the figure. The region R1 is a region of the substrate 10 on which the package 2 is placed. The region R2 is a region of the substrate 10 on which the package 3 is placed. The region R3 is a region between the region R1 and the region R2 of the substrate 10.

The trench 4 is placed in the region R3. When seen through in a direction substantially perpendicular to the uppermost surface 10U, as shown in FIG. 1, the trench 4 does not overlap the package 2 nor package 3 and does not extend off the region (region R3) between the packages 2 and 3 and extends crossing a line segment joining the centers of the packages 2 and 3. The trench 4 may extend, e.g., along the Y direction or at an angle to the Y direction. Further, as shown in FIG. 2, the trench 4 has the opening portion 4p in lower side (−Z side) and extends into the substrate 10, but not to the upper side (+Z side). That is, the trench 4 extends into the substrate 10 from the lowermost surface 10L of the substrate 10 to the uppermost surface 10U side region. For example, the depth of the trench 4 from the lowermost surface 10L is greater than half of the thickness of the substrate 10.

Figure 3:
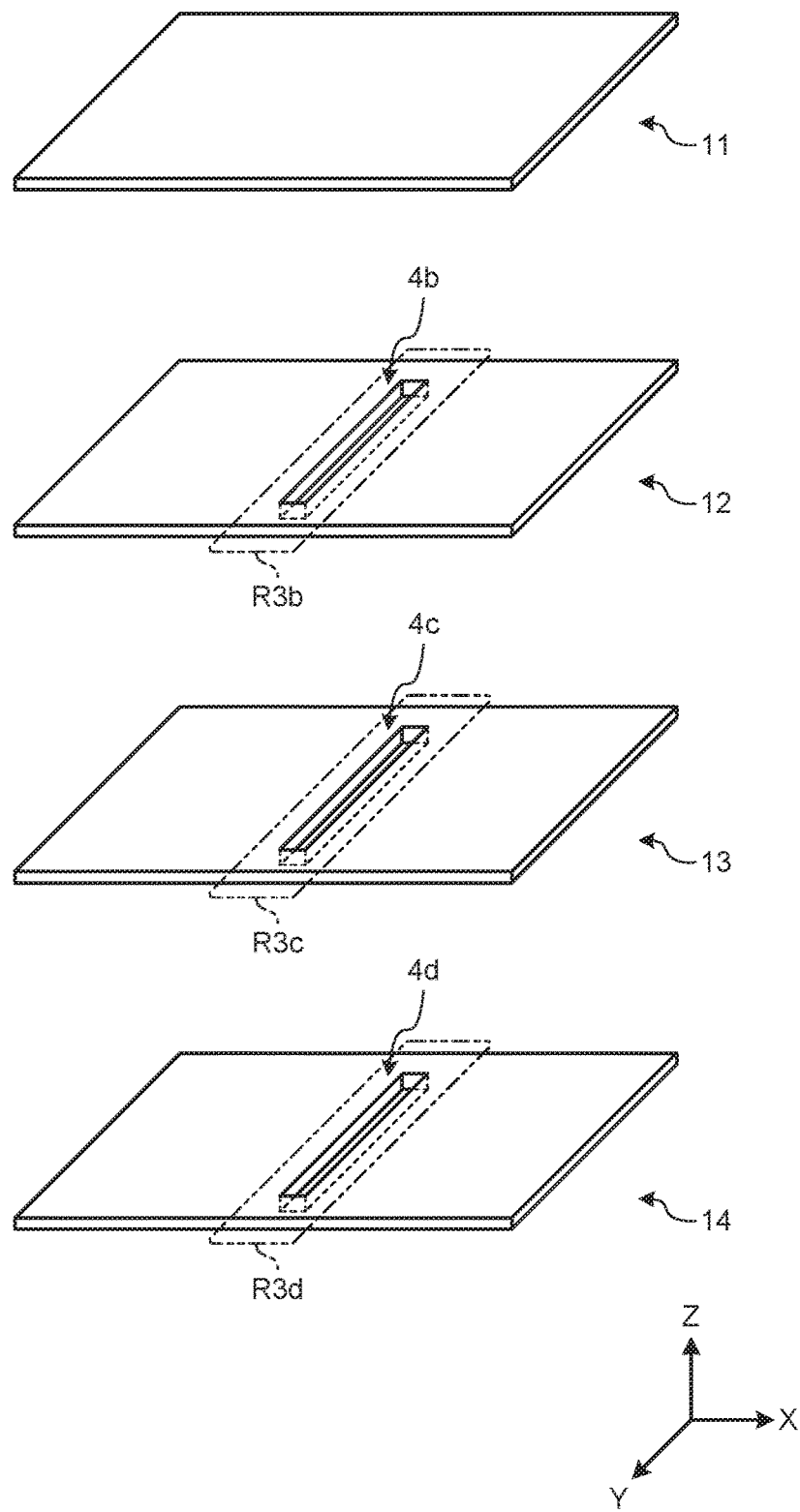
FIG. 3 is an exploded perspective view showing the configuration of the printed circuit board according to the first embodiment.

In the substrate 10, multiple layers 11 to 14 are laid one over another between the uppermost surface (front side) 10U and the lowermost surface (back side) 10L as shown in FIGS. 2 and 3. In FIGS. 2 and 3, the case where the printed circuit board 100 is a four-layered board, that is, where four layers 11 to 14 are laid one over another between the uppermost surface 10U and the lowermost surface 10L is illustrated. FIG. 3 is an exploded perspective view showing the configuration of the printed circuit board 100.

The layer 11 is the first layer (uppermost layer) of the multiple layers 11 to 14. In the layer 11, for using as an area where signal lines between the packages 2 and 3 are placed, no hole is formed as shown in FIG. 3. For example, an insulating layer 11a, a conductor layer 11b, and a solder resist layer 11c are laid one over another in that order in the layer 11. No hole is formed in any of the insulating layer 11a, conductor layer 11b, and solder resist layer 11c. The conductor layer 11b can include signal lines electrically connecting signal terminals (not shown) of the package 2 and signal terminals (not shown) of the package 3. In the conductor layer 11b, since no hole is formed, signal lines connecting signal terminals of the package 2 and signal terminals of the package 3 can be easily shortened.

The layer 12 is the second layer of the multiple layers 11 to 14. In the layer 12, in a region R3b corresponding to the region R3, an opening 4b to form part of the trench 4 (see FIG. 2) is made as shown in FIG. 3. For example, an insulating layer 12a and a conductor layer 12b are laid one over the other in that order in the layer 12. In the insulating layer 12a and conductor layer 12b, the opening 4b to form part of the trench 4 is made. The opening 4b is formed not to reach both ends along the Y direction of the region R3b. Thus, the strength of a required level can be secured for the layer 12. Note that the conductor layer 12b can include a planar interconnection to supply a reference potential such as ground potential or a power supply potential.

The layer 13 is the third layer of the multiple layers 11 to 14. In the layer 13, in a region R3c corresponding to the region R3, an opening 4c to form part of the trench 4 (see FIG. 2) is made as shown in FIG. 3. The opening 4c is formed in a position corresponding to the opening 4b to have a size and shape corresponding to those of the opening 4b. For example, a conductor layer 13a and an insulating layer 13b are laid one over the other in that order in the layer 13. In the conductor layer 13a and insulating layer 13b, the opening 4c to form part of the trench 4 is made. The opening 4c is formed not to reach both ends along the Y direction of the region R3c. Thus, the strength of a required level can be secured for the layer 13. Note that the conductor layer 13a can include a planar interconnection to supply a reference potential such as ground potential or a power supply potential.

The layer 14 is the fourth layer (lowermost layer) of the multiple layers 11 to 14. In the layer 14, in a region R3d corresponding to the region R3, an opening 4d to form part of the trench 4 (see FIG. 2) is made as shown in FIG. 3. The opening 4d is formed in a position corresponding to the opening 4c to have a size and shape corresponding to those of the opening 4c. For example, a solder resist layer 14a, a conductor layer 14b, and an insulating layer 14c are laid one over the other in that order in the layer 14. In the solder resist layer 14a, conductor layer 14b, and insulating layer 14c, the opening 4d to form part of the trench 4 is made. The opening 4d is formed not to reach both ends along the Y direction of the region R3d. Thus, the strength of a required level can be secured for the layer 14.

That is, in the substrate 10, insulating layers and conductor layers are laid one over another in a repeated pattern between the uppermost surface 10U and the lowermost surface 10L. For example, the conductor layer 14b, insulating layer 14c, conductor layer 13a, insulating layer 13b, insulating layer 12a, conductor layer 12b, insulating layer 11a, and conductor layer 11b are laid one over another in that order from the −Z side to the +Z side. For example, excluding the solder resist layers from the insulating layers, the uppermost insulating layer 11a of the multiple insulating layers 11a, 12a, 13b, 14c is exposed through the trench 4 as shown in FIG. 2. The lower surface 11L of the insulating layer 11a forms the bottom of the trench 4.

It should be noted that, by stacking the multiple layers 11 to 14, the printed circuit board 100 (see FIG. 1) having the trench 4 can be formed. Although in the example of FIG. 3 an opening is made in the layers 12 to 14 one by one, the printed circuit board 100 having the trench 4 may be formed by a technique of digging a groove after stacking all the layers 11 to 14. The method of forming the trench 4 is not limited to any.

As indicated by dot-dashed arrows in FIG. 2, where the package 2 large in heat generation and the package 3 susceptible to the influence of temperature are placed a predetermined distance apart along the X direction on the printed circuit board 100, heat generated in the package 2 is less likely to be transmitted to the package 3 because of the trench 4 formed of the openings 4b to 4d made in the layers 12 to 14, the second to fourth layers. Thus, the package 3 can be prevented from being heated above the temperature upper limit of the operation guarantee temperature range, so that the package 3 can be prevented from degrading or lowering in performance due to the influence of heat. Further, with the conductor layer 11b of the layer 11, the first layer, it is easy to make signal lines between the packages 2 and 3 extend linearly in the X direction.

It should be noted that, by forming the trench 4, the ability to radiate heat of the package 2 side is decreased, so that the temperature rises, but if the respective thermal conditions (operation guarantee temperature ranges) of the packages 2 and 3 can be met, a radiation measure is not necessary.

As described above, in the first embodiment, in the printed circuit board 100, the trench 4 is placed between the region R1 and the region R2 of the substrate 10 and is open in lower side (−Z side) and extends into the substrate 10. Thus, it is easy to make signal lines between the packages 2 and 3 extend linearly in the X direction in the conductor layer 11b, for example, and heat transmission between the packages 2 and 3 can be suppressed by the trench 4. As a result, signal lines between the packages 2 and 3 can be easily shortened, and heat transmission between the packages 2 and 3 can be suppressed. That is, in a system where the package 3 susceptible to the influence of heat is mounted, addition of a component for a measure (heat sink) and an increase in board size are not necessary. As a result, an increase in the production cost of the printed circuit board 100 can be suppressed, and an electronic device in which the printed circuit board 100 is used can be made compact.

It should be noted that, although the first embodiment illustrates the case where the two packages 2 and 3 are mounted on the printed circuit board 100, also for a printed circuit board 100 having three or more packages mounted thereon, the same effect can be achieved by forming a trench 4 between packages between which heat transmission is wanted to be suppressed. If multiple regions, between packages between which heat transmission is wanted to be suppressed, exist in the printed circuit board 100 having three or more packages mounted thereon, the trench 4 may have a form in which it has an opening portion 4p in lower side (−Z side) and extends into the substrate 10 (see FIGS. 1, 2) for all the multiple regions. Or the trench 4 may have a form in which it has an opening portion 4p in upper side (+Z side), as described later, and extends into the substrate 10 (see FIGS. 4, 5) for all the multiple regions. Or the trench 4 may have a form in which it has an opening portion 4p in lower side (−Z side) and extends into the substrate 10 (see FIGS. 1, 2) for some of the multiple regions and may have a form in which it has an opening portion 4p in upper side (+Z side) and extends into the substrate 10 (see FIGS. 4, 5) for the rest of the multiple regions.

Although the first embodiment illustrates the case where the uppermost insulating layer 11a of the multiple insulating layers 11a, 12a, 13b, 14c is exposed through the trench 4, an insulating layer (e.g., insulating layer 12a) under the uppermost layer of the multiple insulating layers 11a, 12a, 13b, 14c may be exposed through the trench 4. Or the uppermost conductor layer 11b of the multiple conductor layers 11b, 12b, 13a, 14b may be exposed through the trench 4. Or a conductor layer (e.g., conductor layer 11b) under the uppermost layer of the multiple conductor layers 11b, 12b, 13a, 14b may be exposed through the trench 4. Also in this case, it is easy to make signal lines between the packages 2 and 3 extend linearly in the X direction in the conductor layer 11b, for example, and heat transmission between the packages 2 and 3 can be suppressed by the trench 4.

(Second Embodiment)

Next, a printed circuit board 200 according to the second embodiment will be described. Description will be made below focusing on the differences from the first embodiment.

Although the first embodiment illustrates the case where the trench 4 has the opening portion 4p in lower side (−Z side) and extends into the substrate 10, the second embodiment will illustrate the case where a trench 204 has the opening portion 204p in upper side (+Z side) and extends into the substrate 10.

Figure 4:
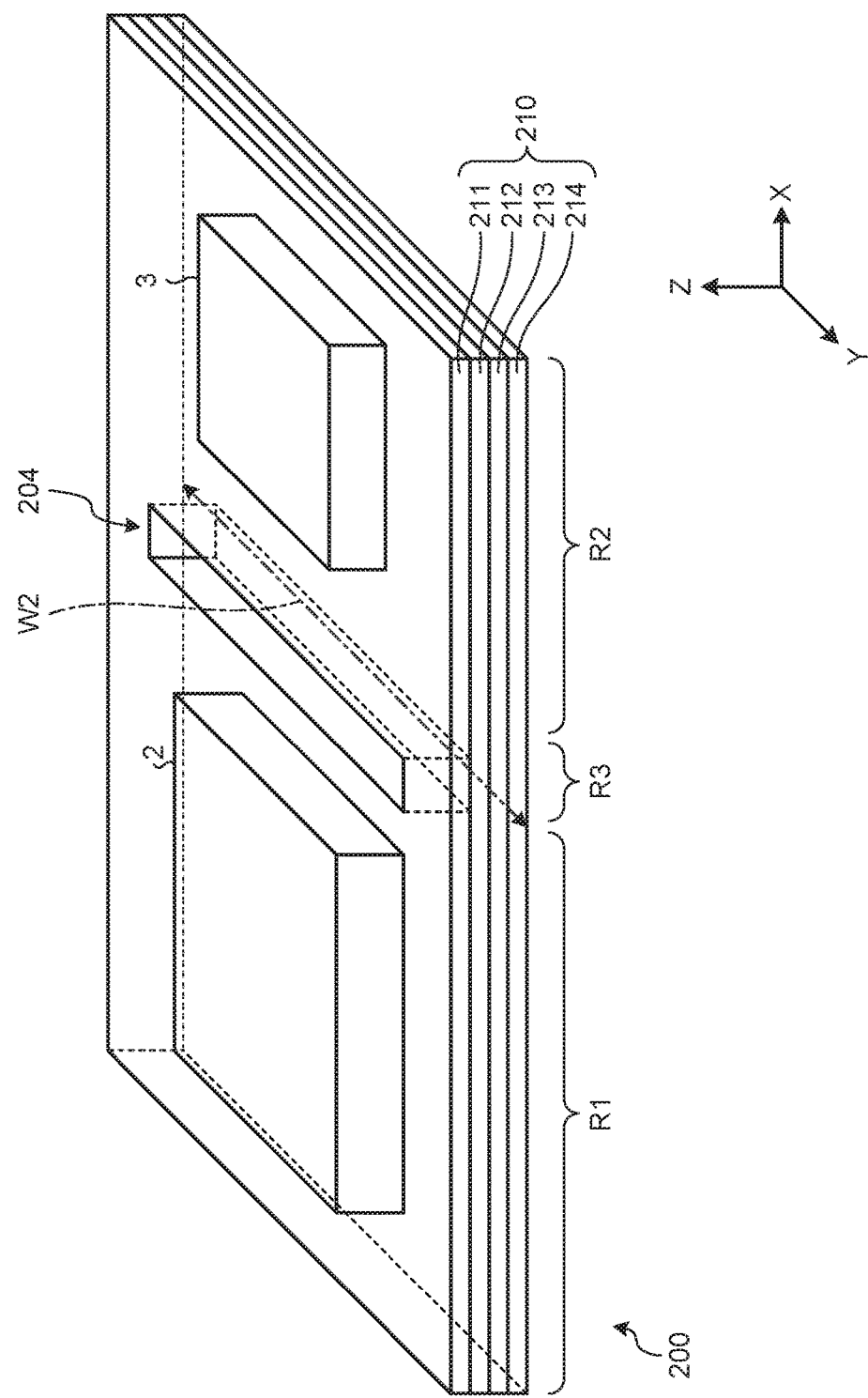
FIG. 4 is a perspective view showing the configuration of a printed circuit board according to a second embodiment.

Specifically, the printed circuit board 200 has a substrate 210 and the trench 204 as shown in FIG. 4. FIG. 4 is a perspective view showing the configuration of the printed circuit board 200.

Figure 5:
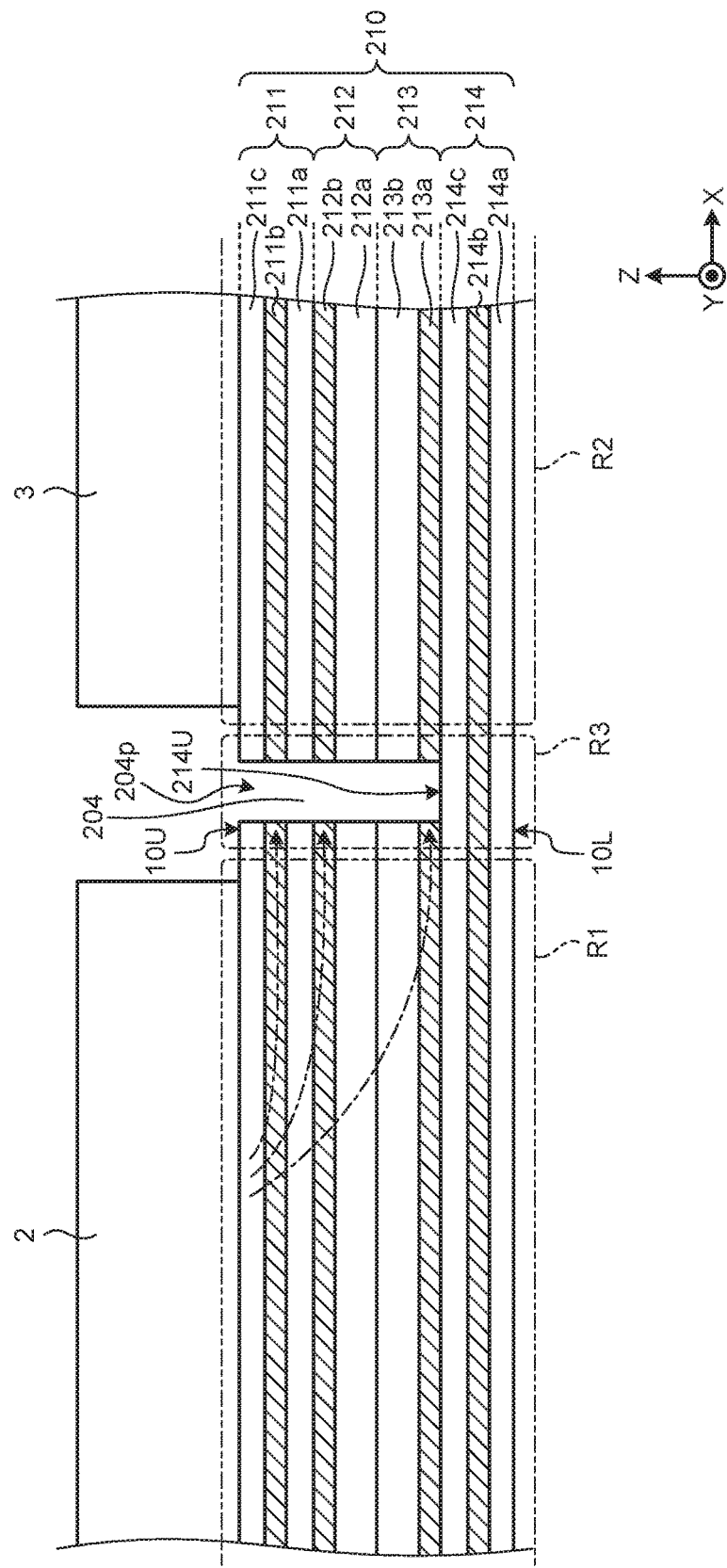
FIG. 5 is an enlarged cross-sectional view showing the configuration of a trench and its vicinity of the printed circuit board according to the second embodiment.

The trench 204 is placed in a region R3. When seen through in a direction substantially perpendicular to the uppermost surface 10U, as shown in FIG. 4, the trench 204 does not overlap the package 2 nor package 3 and extends crossing a line segment joining the centers of the packages 2 and 3. The trench 204 may extend, e.g., along the Y direction or at an angle to the Y direction. Further, as shown in FIG. 5, the trench 204 has the opening portion 204p in upper side (+Z side) and extends into the substrate 10, but not to the lower side (−Z side). That is, the trench 204 extends into the substrate 210 from the uppermost surface 10U of the substrate 210 to the lowermost surface 10L side region. For example, the depth of the trench 204 from the uppermost surface 10U is greater than half of the thickness of the substrate 10. FIG. 5 is an enlarged cross-sectional view showing the configuration of the trench 204 and its vicinity of the printed circuit board 200.

Figure 6:
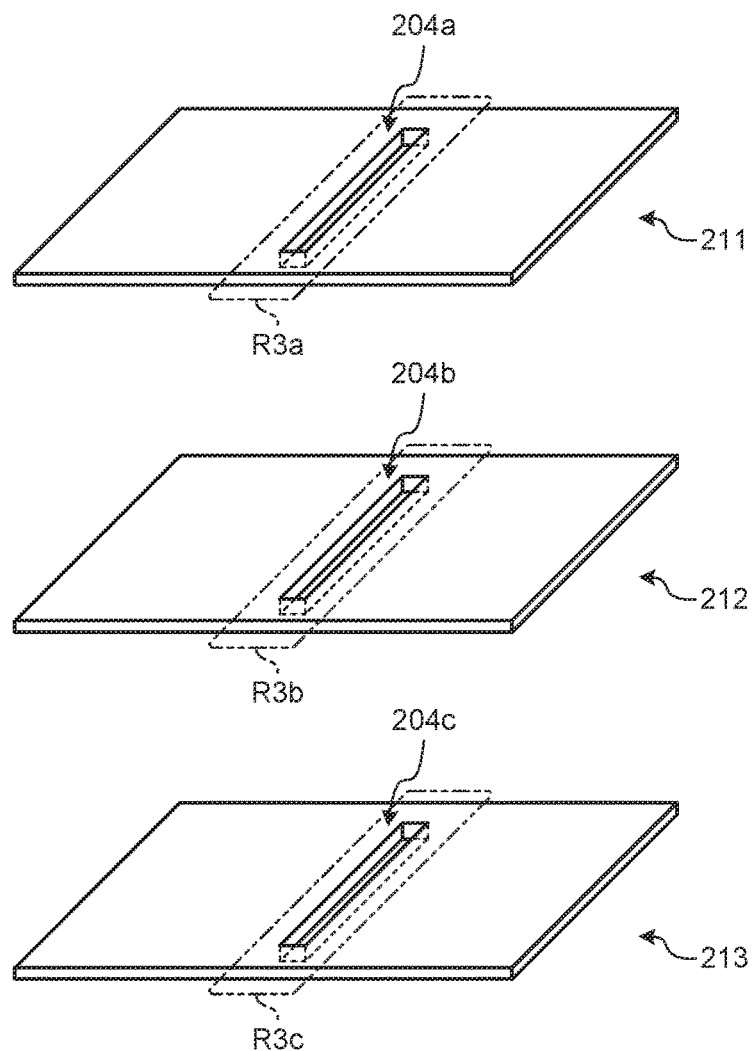
FIG. 6 is an exploded perspective view showing the configuration of the printed circuit board according to the second embodiment.

In the substrate 210, multiple layers 211 to 214 are laid one over another between the uppermost surface 10U and the lowermost surface 10L as shown in FIGS. 5 and 6. FIG. 6 is an exploded perspective view showing the configuration of the printed circuit board 200.

The layer 211 is the first layer (uppermost layer) of the multiple layers 211 to 214. In the layer 211, in a region R3a corresponding to the region R3, an opening 204a to form part of the trench 204 (see FIG. 5) is made as shown in FIG. 6. For example, an insulating layer 211a, a conductor layer 211b, and a solder resist layer 211c are laid one over another in that order in the layer 211. In the insulating layer 211a, conductor layer 211b, and solder resist layer 211c, the opening 204a to form part of the trench 204 is made. The opening 204a is formed not to reach both ends along the Y direction of the region R3a. Thus, the strength of a required level can be secured for the layer 211.

The layer 212 is the second layer of the multiple layers 211 to 214. In the layer 212, in a region R3b corresponding to the region R3, an opening 204b to form part of the trench 204 (see FIG. 5) is made as shown in FIG. 6. The opening 204b is formed in a position corresponding to the opening 204a to have a size and shape corresponding to those of the opening 204a. For example, an insulating layer 212a and a conductor layer 212b are laid one over the other in that order in the layer 212. In the insulating layer 212a and conductor layer 212b, the opening 204b to form part of the trench 204 is made. The opening 204b is formed not to reach both ends along the Y direction of the region R3b. Thus, the strength of a required level can be secured for the layer 212. Note that the conductor layer 212b can include a planar interconnection to supply a reference potential such as ground potential or a power supply potential.

The layer 213 is the third layer of the multiple layers 211 to 214. In the layer 213, in a region R3c corresponding to the region R3, an opening 204c to form part of the trench 204 (see FIG. 5) is made as shown in FIG. 6. The opening 204c is formed in a position corresponding to the opening 204b to have a size and shape corresponding to those of the opening 204b. For example, a conductor layer 213a and an insulating layer 213b are laid one over the other in that order in the layer 213. In the conductor layer 213a and insulating layer 213b, the opening 204c to form part of the trench 204 is made. The opening 204c is formed not to reach both ends along the Y direction of the region R3c. Thus, the strength of a required level can be secured for the layer 213. Note that the conductor layer 213a can include a planar interconnection to supply a reference potential such as ground potential or a power supply potential.

The layer 214 is the fourth layer (lowermost layer) of the multiple layers 211 to 214. In the layer 214, for using as an area where signal lines between the packages 2 and 3 are placed, no trench is formed as shown in FIG. 6. For example, a solder resist layer 214a, a conductor layer 214b, and an insulating layer 214c are laid one over another in that order in the layer 214. No trench is formed in any of the solder resist layer 214a, conductor layer 214b, and insulating layer 214c. The conductor layer 214b can include signal lines electrically connecting signal terminals (not shown) of the package 2 and signal terminals (not shown) of the package 3. In the conductor layer 214b, since no trench is formed, signal lines connecting signal terminals of the package 2 and signal terminals of the package 3 can be easily shortened. Note that the signal lines included in the conductor layer 214b may be connected to, e.g., via electrodes insulated by insulating layers or the like from the conductor layers 213a, 212b, 211b and extending from the conductor layer 214b to signal terminals of the package 2 or signal terminals of the package 3 through the layers 213, 212, 211.

That is, in the substrate 210, insulating layers and conductor layers are laid one over another in a repeated pattern between the uppermost surface 10U and the lowermost surface 10L. For example, the conductor layer 214b, insulating layer 214c, conductor layer 213a, insulating layer 213b, insulating layer 212a, conductor layer 212b, insulating layer 211a, and conductor layer 211b are laid one over another in that order from the −Z side to the +Z side. For example, excluding the solder resist layers from the insulating layers, the lowermost insulating layer 214c of the multiple insulating layers 211a, 212a, 213b, 214c is exposed through the trench 204 as shown in FIG. 5. The upper surface 214U of the insulating layer 214c forms the bottom of the trench 204.

As indicated by dot-dashed arrows in FIG. 5, where the package 2 large in heat generation and the package 3 susceptible to the influence of temperature are placed a predetermined distance apart along the X direction on the printed circuit board 200, heat generated in the package 2 is less likely to be transmitted to the package 3 because of the trench 204 formed of the openings 204a to 204c made in the layers 211 to 213. Thus, the package 3 can be prevented from being heated above the temperature upper limit of the operation guarantee temperature range, so that the package 3 can be prevented from degrading due to the influence of heat. Further, with the layer 214, the fourth layer, the ability to wire for signal lines between the packages 2 and 3 can be secured.

It should be noted that, when seeing heat transmission paths in an X-Z cross-section including the trench, in the second embodiment the path is from the package 2 to the layer 211 to the layer 212 to the layer 213 to the layer 214 to the layer 213 to the layer 212 to the layer 211 to the package 3 (see FIG. 5), whereas in the first embodiment the path is from the package 2 to the layer 11 to the package 3 (see FIG. 2). Thus, thermal resistance between the packages 2 and 3 can be made larger than in the first embodiment, so that the temperature of the package 3 can be suppressed to a low.

As described above, in the second embodiment, in the printed circuit board 200, the trench 204 is placed between the region R1 and the region R2 of the substrate 210 and has the opening portion 204p in upper side (+Z side) and extends into inner portion of the substrate 210. Thus, it is easy to make signal lines between the packages 2 and 3 extend linearly in the X direction in the conductor layer 214b, for example, and heat transmission between the packages 2 and 3 can be suppressed by the trench 204. As a result, signal lines between the packages 2 and 3 can be easily shortened, and heat transmission between the packages 2 and 3 can be suppressed.

Figure 7:
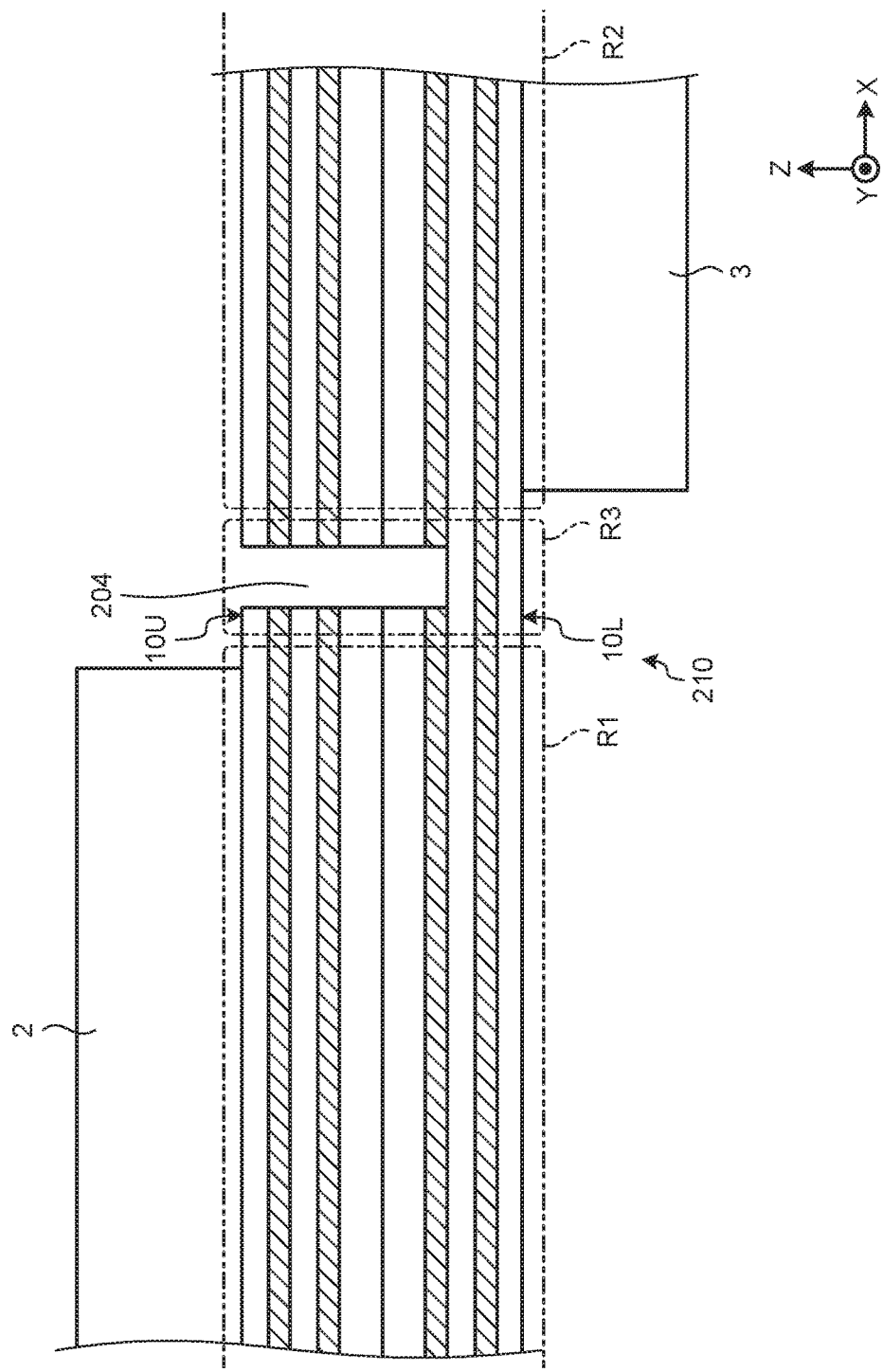
FIG. 7 is an enlarged cross-sectional view showing the configuration of a trench and its vicinity of a printed circuit board according to a modified example of the second embodiment.

It should be noted that, in the printed circuit board according to the first embodiment or the second embodiment, a change may be made such that one of the two packages 2, 3 is mounted on the uppermost surface 10U of the substrate 210 while the other is mounted on the lowermost surface 10L. For example, where a change is made in the printed circuit board according to the second embodiment, the package 2 may be mounted on the uppermost surface 10U in the region R1, and the package 3 may be mounted on the lowermost surface 10L in the region R2 as shown in FIG. 7. Also in this case, because the trench 204 is placed in the region R3 between the regions R1 and R2, heat transmission between the packages 2 and 3 can be suppressed by the trench 204. Further, signal lines between the packages 2 and 3 can be secured with the conductor layer 214b, for example.

Although the second embodiment illustrates the case where the lowermost insulating layer 214c of the multiple insulating layers 211a, 212a, 213b, 214c is exposed through the trench 204, an insulating layer (e.g., insulating layer 213b) above the lowermost layer of the multiple insulating layers 211a, 212a, 213b, 214c may be exposed through the trench 204. Or the lowermost conductor layer 214b of the multiple conductor layers 211b, 212b, 213a, 214b may be exposed through the trench 204. Or a conductor layer (e.g., conductor layer 213a) above the lowermost layer of the multiple conductor layers 211b, 212b, 213a, 214b may be exposed through the trench 204. Also in this case, it is easy to make signal lines between the packages 2 and 3 extend linearly in the X direction in the conductor layer 214b, for example, and heat transmission between the packages 2 and 3 can be suppressed by the trench 204.

(Third Embodiment)

Next, a printed circuit board 300 according to the third embodiment will be described. Description will be made below focusing on the differences from the first embodiment.

Although the first embodiment illustrates the case where, across the region R3, the trench 4 does not penetrate the substrate 10, the third embodiment will illustrate the case where a trench 304 penetrates a substrate 310 in part of the region R3.

Figure 8:
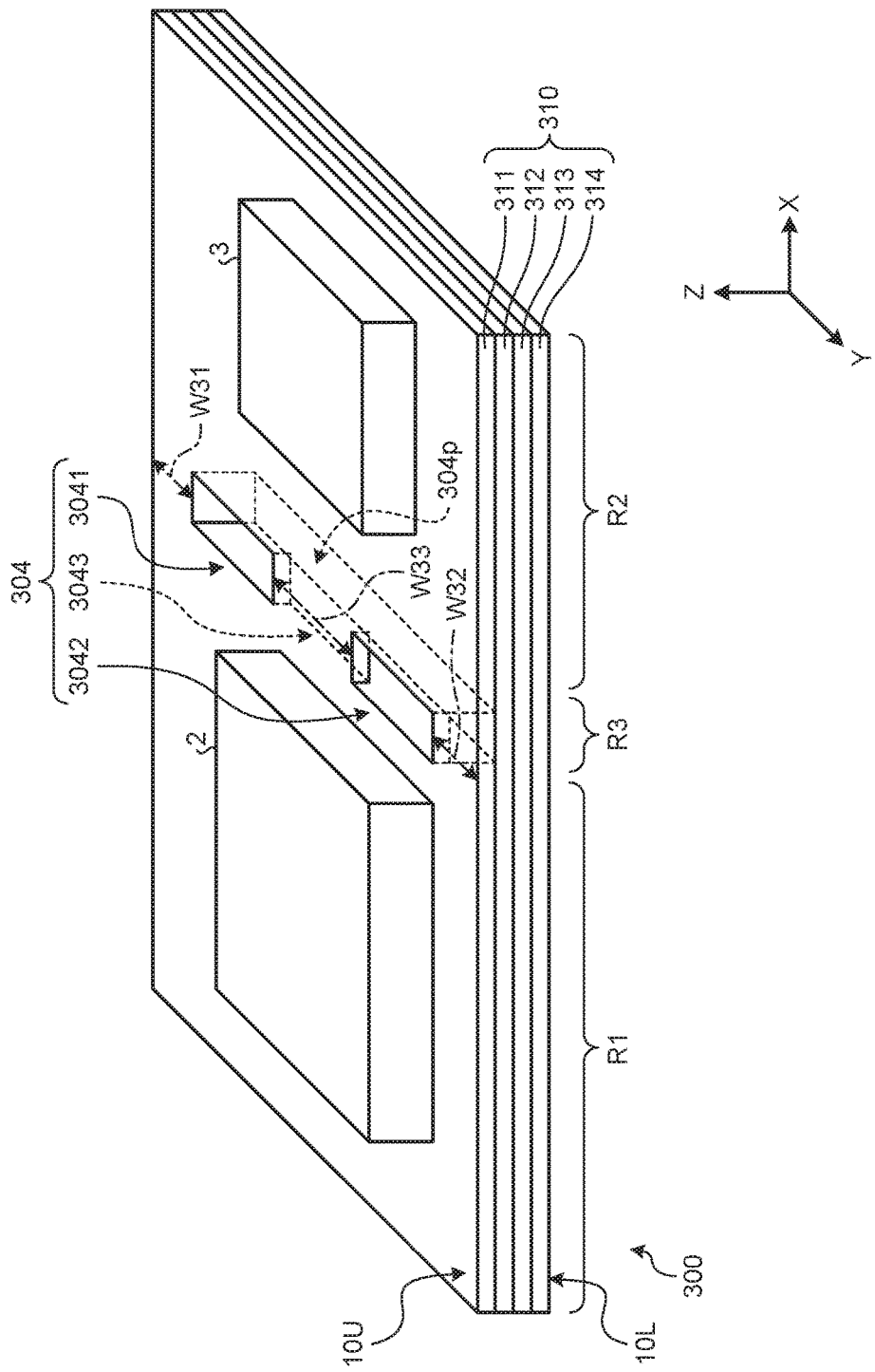
FIG. 8 is a perspective view showing the configuration of a printed circuit board according to a third embodiment.

Specifically, the printed circuit board 300 has the substrate 310 and the trench 304 as shown in FIG. 8. FIG. 8 is a perspective view showing the configuration of the printed circuit board 300. The trench 304 has an opening portion 304p in lower side (−Z side) and has a portion 3043 not extending to the upper side (+Z side) and portions 3041, 3042 extending to the upper side (+Z side). When seen through in the Z direction, the portion 3043 crosses a line segment joining the centers of the packages 2 and 3.

In the substrate 310, multiple layers 311 to 314 are laid one over another between the uppermost surface 10U and the lowermost surface 10L as shown in FIGS. 8 and 9. FIG. 9 is an exploded perspective view showing the configuration of the printed circuit board 300.

The layer 311 is the first layer (uppermost layer) of the multiple layers 311 to 314. In the layer 311, in a region R3a corresponding to the region R3, two openings 304a1, 304a2 to form part of the trench 304 (see FIG. 8) are made as shown in FIG. 9. The opening 304a1 is an opening to form part of the portion 3041. The opening 304a2 is an opening to form part of the portion 3042. The two openings 304a1, 304a2 are formed not to reach both ends along the Y direction of the region R3a. Thus, the strength of a required level can be secured for the layer 311. The portion 3111 between the two openings 304a1, 304a2 in the layer 311 can be used as part of an area where signal lines between the packages 2 and 3 are placed. For example, the conductor layer 11b (see FIG. 2) in the layer 311 can include signal lines electrically connecting signal terminals (not shown) of the package 2 and signal terminals (not shown) of the package 3. In the conductor layer 11b, since the part on the package 2 side and the part on the package 3 side are connected by the portion 3111, signal lines connecting signal terminals of the package 2 and signal terminals of the package 3 can be easily shortened.

The layer 312 is the second layer of the multiple layers 311 to 314. In the layer 312, in a region R3b corresponding to the region R3, an opening 304b to form part of the trench 304 (see FIG. 8) is made as shown in FIG. 9. The opening 304b is formed not to reach both ends along the Y direction of the region R3b. Thus, the strength of a required level can be secured for the layer 312.

The layer 313 is the third layer of the multiple layers 311 to 314. In the layer 313, in a region R3c corresponding to the region R3, an opening 304c to form part of the trench 304 (see FIG. 8) is made as shown in FIG. 9. The opening 304c is formed in a position corresponding to the opening 304b to have a size and shape corresponding to those of the opening 304b. The opening 304c is formed not to reach both ends along the Y direction of the region R3c. Thus, the strength of a required level can be secured for the layer 313.

The layer 314 is the fourth layer (lowermost layer) of the multiple layers 311 to 314. In the layer 314, in a region R3d corresponding to the region R3, an opening 304d to form part of the trench 304 (see FIG. 8) is made as shown in FIG. 9. The opening 304d is formed in a position corresponding to the opening 304c to have a size and shape corresponding to those of the opening 304c. The opening 304d is formed not to reach both ends along the Y direction of the region R3d. Thus, the strength of a required level can be secured for the layer 314.

That is, through the portion 3043 of the trench 304, the uppermost insulating layer 11a (see FIG. 2) of the multiple insulating layers 11a, 12a, 13b, 14c is exposed while the portions 3041, 3042 penetrate the substrate 310 in the Z direction. Among the multiple conductor layers 11b, 12b, 13a, 14b (see FIG. 2), the portions 3041, 3042 penetrate the uppermost conductor layer 11b while the portion 3043 does not penetrate the uppermost conductor layer 11b.

As described above, in the third embodiment, in the printed circuit board 300, the trench 304 partially penetrates from the uppermost surface 10U to the lowermost surface 10L when seen in a direction substantially perpendicular to the uppermost surface 10U. When seeing heat transmission paths in an X-Z cross-section (see FIG. 2) including the portion 3043, the point that the path is from the package 2 to the layer 311 to the package 3 is the same as in the first embodiment, but the total width (W31+W32+W33) along the Y direction of the heat transmission path in the layer 311 can be made narrower than the width W1 (see FIG. 1) along the Y direction of the heat transmission path in the layer 11 in the first embodiment (W31+W32+W33<W1). That is, when seeing in a Y-Z cross-section (not shown) including the trench, the cross-section area of the heat transmission path corresponding to the total width (W31+W32+W33) along the Y direction in the layer 311 is smaller than the cross-section area of the heat transmission path corresponding to the width W1 along the Y direction in the layer 11 in the first embodiment. In other words, by providing the portion 3043 not penetrating in the trench 304, an area for making signal lines between the packages 2 and 3 extend linearly in the X direction is secured in the layer 311 while heat transmission between the packages 2 and 3 can be further suppressed by providing the portions 3041, 3042 penetrating. Therefore, it is easy to make signal lines between the packages 2 and 3 extend linearly in the X direction in the conductor layer in the layer 311, for example, and heat transmission between the packages 2 and 3 can be further suppressed by the trench 304. As a result, signal lines between the packages 2 and 3 can be easily shortened, and heat transmission between the packages 2 and 3 can be further suppressed.

(Fourth Embodiment)

Next, a printed circuit board 400 according to the fourth embodiment will be described. Description will be made below focusing on the differences from the second embodiment.

Although the second embodiment illustrates the case where, across the region R3, the trench 204 does not penetrate the substrate 210, the fourth embodiment will illustrate the case where a trench 404 penetrates a substrate 410 in part of the region R3.

Figure 10:
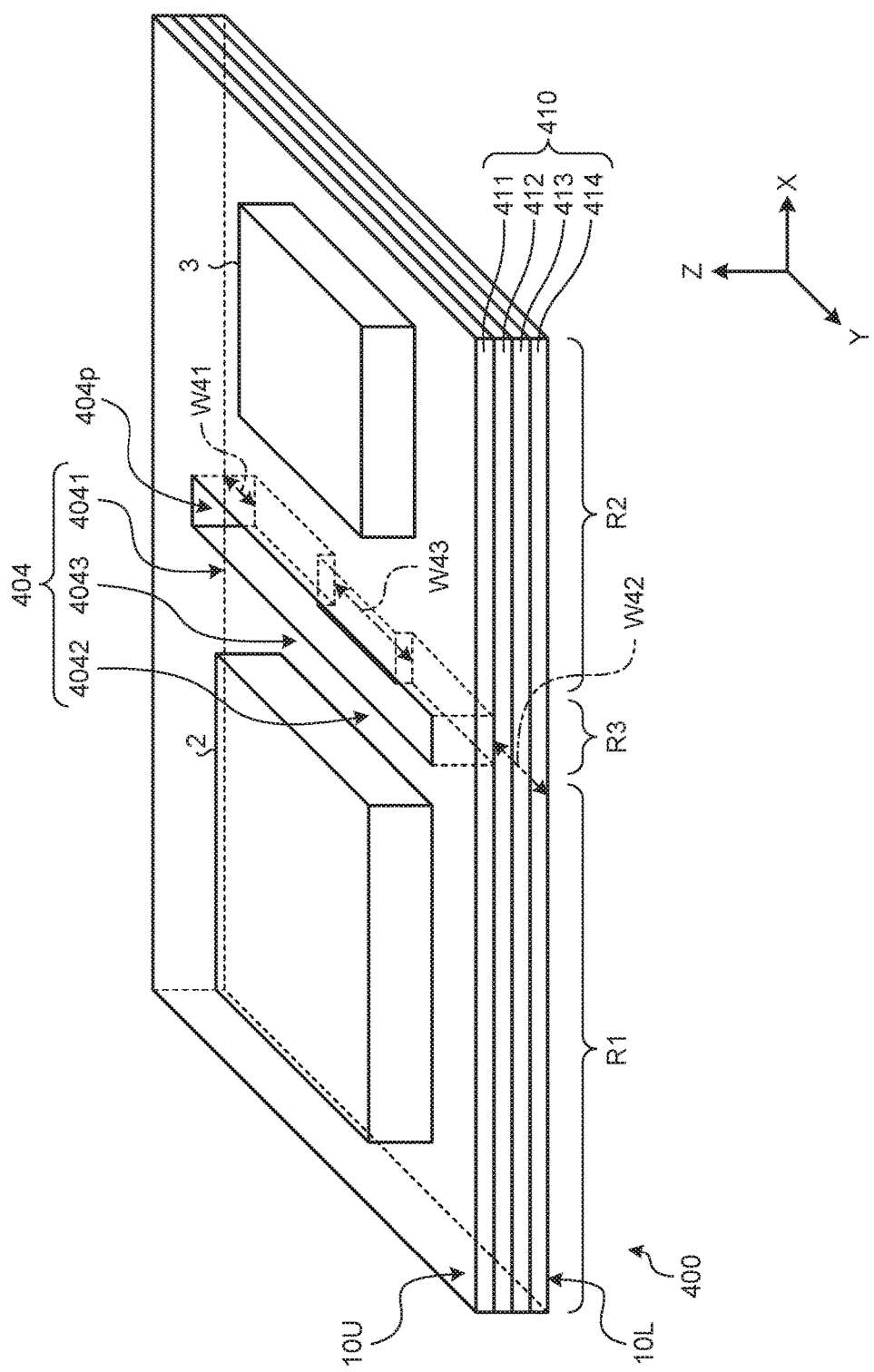
FIG. 10 is a perspective view showing the configuration of a printed circuit board according to a fourth embodiment.

Specifically, the printed circuit board 400 has the substrate 410 and the trench 404 as shown in FIG. 10. FIG. 10 is a perspective view showing the configuration of the printed circuit board 400. The trench 404 has an opening portion 404p in upper side (+Z side) and has a portion 4043 not extending to the lower side (−Z side) and portions 4041, 4042 extending to the lower side (−Z side). When seen through in the Z direction, the portion 4043 crosses a line segment joining the centers of the packages 2 and 3.

Figure 11:
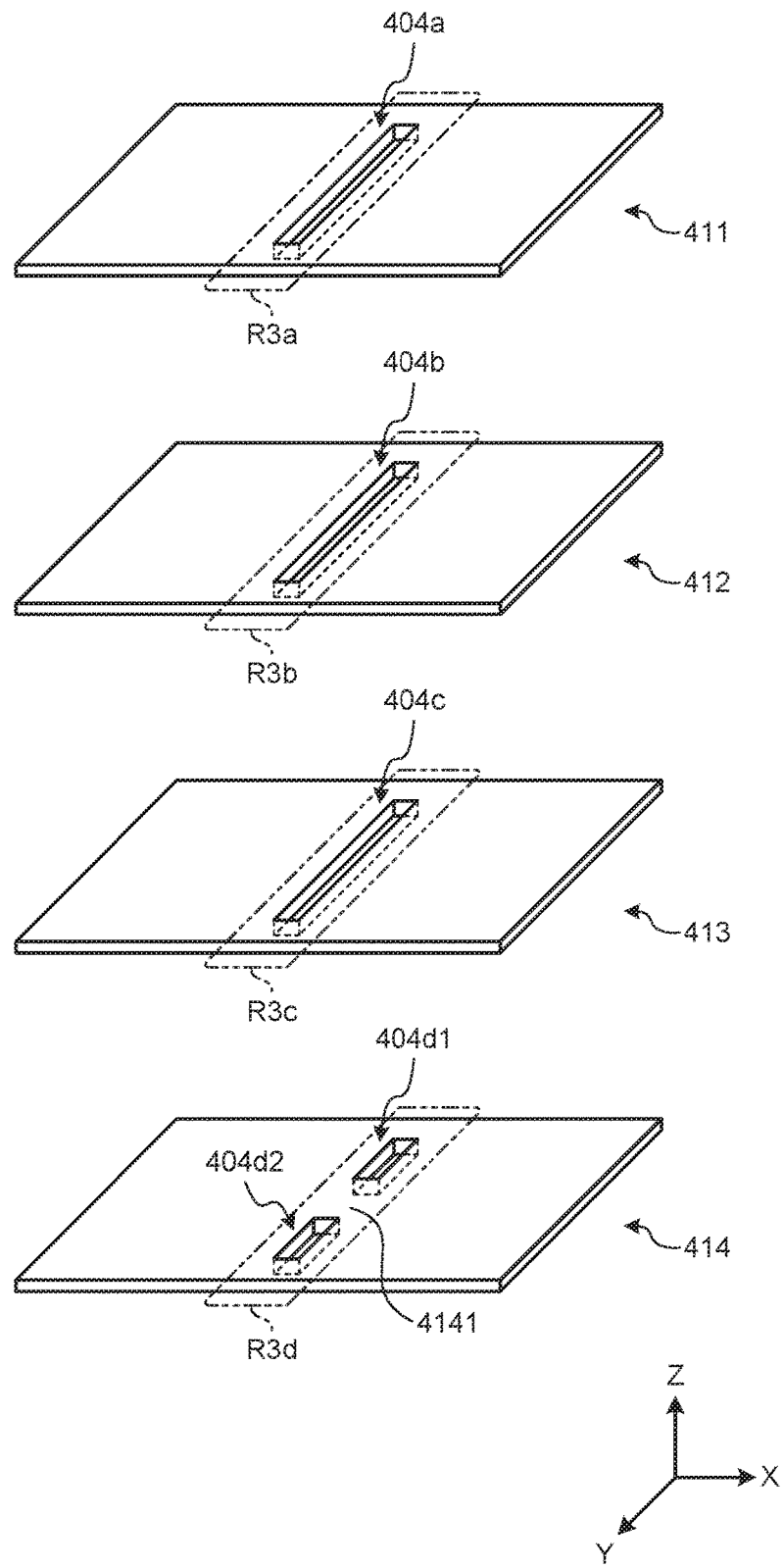
FIG. 11 is an exploded perspective view showing the configuration of the printed circuit board according to the fourth embodiment.

In the substrate 410, multiple layers 411 to 414 are laid one over another between the uppermost surface 10U and the lowermost surface 10L as shown in FIGS. 10 and 11. FIG. 11 is an exploded perspective view showing the configuration of the printed circuit board 400.

The layer 411 is the first layer (uppermost layer) of the multiple layers 411 to 414. In the layer 411, in a region R3a corresponding to the region R3, an opening 404a to form part of the trench 404 (see FIG. 10) is made as shown in FIG. 11. The opening 404a is formed not to reach both ends along the Y direction of the region R3a. Thus, the strength of a required level can be secured for the layer 411.

The layer 412 is the second layer of the multiple layers 411 to 414. In the layer 412, in a region R3b corresponding to the region R3, an opening 404b to form part of the trench 404 (see FIG. 10) is made as shown in FIG. 11. The opening 404b is formed in a position corresponding to the opening 404a to have a size and shape corresponding to those of the opening 404a. The opening 404b is formed not to reach both ends along the Y direction of the region R3b. Thus, the strength of a required level can be secured for the layer 412.

The layer 413 is the third layer of the multiple layers 411 to 414. In the layer 413, in a region R3c corresponding to the region R3, an opening 404c to form part of the trench 404 (see FIG. 10) is made as shown in FIG. 11. The opening 404c is formed in a position corresponding to the opening 404b to have a size and shape corresponding to those of the opening 404b. The opening 404c is formed not to reach both ends along the Y direction of the region R3c. Thus, the strength of a required level can be secured for the layer 413.

The layer 414 is the fourth layer (lowermost layer) of the multiple layers 411 to 414. In the layer 414, in a region R3d corresponding to the region R3, two openings 404d1, 404d2 to form part of the trench 404 (see FIG. 10) is made as shown in FIG. 11. The opening 404d1 is an opening to form part of the portion 4041. The opening 404d2 is an opening to form part of the portion 4042. The two openings 404d1, 404d2 are formed not to reach both ends along the Y direction of the region R3d. Thus, the strength of a required level can be secured for the layer 414. The portion 4141 between the two openings 404d1, 404d2 in the layer 414 can be used as part of an area where signal lines between the packages 2 and 3 are placed. For example, the conductor layer 214b (see FIG. 5) in the layer 414 can include signal lines electrically connecting signal terminals (not shown) of the package 2 and signal terminals (not shown) of the package 3. In the conductor layer 214b, since the part on the package 2 side and the part on the package 3 side are connected by the portion 4141, signal lines connecting signal terminals of the package 2 and signal terminals of the package 3 can be easily shortened.

That is, through the portion 4043 of the trench 404, the lowermost insulating layer 214a (see FIG. 5) of the multiple insulating layers 211a, 212a, 213b, 214c is exposed while the portions 4041, 4042 penetrate the substrate 410 in the Z direction. Among the multiple conductor layers 211b, 212b, 213a, 214b (see FIG. 5), the portions 4041, 4042 penetrate the lowermost conductor layer 214b while the portion 4043 does not penetrate the lowermost conductor layer 214b.

As described above, in the fourth embodiment, in the printed circuit board 400, the trench 404 partially penetrates from the uppermost surface 10U to the lowermost surface 10L when seen in a direction substantially perpendicular to the uppermost surface 10U. When seeing heat transmission paths in an X-Z cross-section (see FIG. 5) including the portion 4043, the point that the path is from the package 2 to the layer 411 to the layer 412 to the layer 413 to the layer 414 to the layer 413 to the layer 412 to the layer 411 to the package 3 is the same as in the second embodiment, but the total width (W41+W42+W43) along the Y direction of the heat transmission path in the layer 414 can be made narrower than the width W2 (see FIG. 4) along the Y direction of the heat transmission path in the second embodiment (W41+W42+W43<W2). That is, when seeing in a Y-Z cross-section (not shown) including the trench, the cross-section area of the heat transmission path corresponding to the total width (W41+W42+W43) along the Y direction in the layer 411 is smaller than the cross-section area of the heat transmission path corresponding to the width W2 along the Y direction in the layer 211 in the second embodiment. In other words, by providing the portion 4043 not penetrating in the trench 404, an area for making signal lines between the packages 2 and 3 extend linearly in the X direction is secured in the layer 414 while heat transmission between the packages 2 and 3 can be further suppressed by providing the portions 4041, 4042 penetrating. Therefore, it is easy to make signal lines between the packages 2 and 3 extend linearly in the X direction in the conductor layer in the layer 414, for example, and heat transmission between the packages 2 and 3 can be further suppressed by the trench 404. As a result, signal lines between the packages 2 and 3 can be easily shortened, and heat transmission between the packages 2 and 3 can be further suppressed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A printed circuit board comprising
a substrate having a trench between a first region and a second region, the first region being a region where a first package is to be mounted, the second region being a region where a second package is to be mounted,
wherein the substrate has a first main surface and a second main surface, the first main surface being a surface on which the first package is placed, the second main surface being positioned on a reverse side of the first main surface of the substrate,
the trench has an opening portion in the second main surface,
a depth of the trench from the second main surface is greater than half of a thickness of the substrate,
the trench does not reach the first main surface,
the substrate includes a conductor layer positioned near the first main surface and via which terminals of the first package and terminals of the second package are electrically connected, and
the trench does not penetrate the conductor layer.

2. The printed circuit board according to claim 1, wherein when seen through in a direction substantially perpendicular to the first main surface, the trench does not overlap the first package nor the second package and extends in a direction crossing a line segment joining the centers of the first and second packages.

3. The printed circuit board according to claim 2, wherein when seen through in a direction substantially perpendicular to the first main surface, the trench extends in a direction substantially perpendicular to the line segment.

4. The printed circuit board according to claim 2, wherein when seen through in a direction substantially perpendicular to the first main surface, the trench extends in an inclined direction to the line segment.

5. The printed circuit board according to claim 2, wherein
when seen through in a direction substantially perpendicular to the first main surface, the trench does not reach both ends of the substrate in a direction crossing the line segment.

6. A printed circuit board comprising
a substrate having a trench between a first region and a second region, the first region being a region where a first package is to be mounted, the second region being a region where a second package is to be mounted,
wherein the substrate has a first main surface and a second main surface, the first main surface being a surface on which the first package is placed, the second main surface being positioned on a reverse side of the first main surface of the substrate,
the trench has an opening portion in the first main surface, and
a depth of the trench from the first main surface is greater than half of a thickness of the substrate,
the trench does not reach the second main surface,
the substrate includes a conductor layer placed near the second main surface and via which terminals of the first package and terminals of the second package are electrically connected, and
the trench does not penetrate the conductor layer.

7. The printed circuit board according to claim 6, wherein
when seen through in a direction substantially perpendicular to the first main surface, the trench does not overlap the first package nor the second package and extends in a direction crossing a line segment joining the centers of the first and second packages.

8. The printed circuit board according to claim 7, wherein
when seen through in a direction substantially perpendicular to the first main surface, the trench extends in a direction substantially perpendicular to the line segment.

9. The printed circuit board according to claim 7, wherein
when seen through in a direction substantially perpendicular to the first main surface, the trench extends in an inclined direction to the line segment.

10. The printed circuit board according to claim 7, wherein
when seen through in a direction substantially perpendicular to the first main surface, the trench does not reach both ends of the substrate in a direction crossing the line segment.

11. A printed circuit board comprising
a substrate having a trench between a first region and a second region, the first region being a region where a first package is to be mounted, the second region being a region where a second package is to be mounted,
wherein the substrate has a first main surface and a second main surface, the first main surface being a surface on which the first package is placed, the second main surface being positioned on a reverse side of the first main surface of the substrate,
when seen in a direction substantially perpendicular to the first main surface, the trench partially penetrates the substrate, and
the trench has:
a first portion penetrating from the first main surface to the second main surface of the substrate;
a second portion penetrating from the first main surface to the second main surface of the substrate; and
a third portion that, when seen in a direction substantially perpendicular to the first main surface, is placed between the first portion and the second portion and that does not penetrate from the first main surface to the second main surface of the substrate.

12. The printed circuit board according to claim 11, wherein
the third portion has the opening portion in the second main surface, and
a depth of the third portion from the second main surface is greater than half of a thickness of the substrate.

13. The printed circuit board according to claim 12, wherein
the substrate includes a conductor layer placed near the first main surface and via which terminals of the first package and terminals of the second package are electrically connected, and
wherein the first portion and the second portion penetrate the conductor layer respectively, and
the third portion does not penetrate the conductor layer.

14. The printed circuit board according to claim 11, wherein
the third portion has the opening portion on the first main surface, and
a depth of the third portion from the first main surface is greater than half of a thickness of the substrate.

15. The printed circuit board according to claim 14, wherein
the substrate includes a conductor layer positioned near the second main surface and via which terminals of the first package and terminals of the second package are electrically connected, and
wherein the first portion and the second portion penetrate the conductor layer respectively, and
the third portion does not penetrate the conductor layer.

16. The printed circuit board according to claim 11, wherein
when seen through in a direction substantially perpendicular to the first main surface, the third portion does not overlap the first package nor the second package and extends in a direction crossing a line segment joining the centers of the first and second packages.

17. The printed circuit board according to claim 16, wherein
when seen through in a direction substantially perpendicular to the first main surface, the first portion and the second portion do not reach both ends of the substrate in a direction crossing the line segment respectively.

* * * * *